United States Patent [19]

Dougherty et al.

[11] Patent Number: 5,465,420
[45] Date of Patent: Nov. 7, 1995

[54] TRANSCONDUCTANCE MIXER WITH FEEDBACK

[75] Inventors: Richard M. Dougherty; Glenn R. Fraser, both of Scottsdale, Ariz.

[73] Assignee: Motorola, Inc., Schaumburg, Ill.

[21] Appl. No.: 292,944

[22] Filed: Aug. 18, 1994

Related U.S. Application Data

[63] Continuation of Ser. No. 31,413, Mar. 15, 1993, abandoned.

[51] Int. Cl.$^6$ .................................................. H04B 1/28
[52] U.S. Cl. ........................ 455/333; 455/330; 327/355
[58] Field of Search ................................... 455/330, 333, 455/323, 313; 307/529; 328/158; 333/32; 331/43; 327/355, 358, 356, 427, 434, 551, 552

[56] References Cited

U.S. PATENT DOCUMENTS

| | | | |
|---|---|---|---|
| 3,976,944 | 8/1976 | Kreng | 325/451 |
| 4,449,245 | 5/1984 | Rabe | 455/319 |
| 4,592,095 | 5/1986 | Ohnishi | 455/327 |
| 4,631,500 | 12/1986 | Rauscher | 455/333 |
| 4,814,649 | 3/1989 | Young | 307/529 |
| 5,263,198 | 11/1993 | Geddes et al. | 455/333 |

FOREIGN PATENT DOCUMENTS 0679421  2/1964  Canada ............................. 455/333

OTHER PUBLICATIONS

Stephen A. Maas "Microwave Mixers" Artech House, 1993.
J. E. Sitch and P. N. Robson, "The performance of GaAs Field Effect Transistors as Microwave Mixers," Proc. IEEE, vol. 61, 1973, p. 399.
P. Bur, "70 MHz to 6 GHz Upconverter," Electron Lett., vol. 17.
Stephen A. Maas "Nonliner Microwave Circuits" Artech House, 1988.
R. Dessert, P. Harrop, B. Kramer and T. Vlek "All–FET Front End for 12 GHZ Satellite Broadcasting Reception," Proc. 8th Annual European Microwave Conf., 1978, p. 638.

*Primary Examiner*—Edward F. Urban
*Assistant Examiner*—Doris To
*Attorney, Agent, or Firm*—Jeffrey D. Nehr; Robert M. Handy; Frank J. Bogacz

[57] ABSTRACT

A non-linear active device (32), such as a FET, multiplies multiplicand signals to generate a product signal. A combining circuit (24) combines multiplicand signals into a combined signal. An input matching and conditioning network (28) couples the combined signal to an input of the active device (32). This network (28) matches impedances between sources for the multiplicand signals and the active device (32) at the frequencies of the multiplicand signals, and desirably shorts the product signal's frequencies. A feedback resistor (36) couples between the output and input of the active device (32) to lower impedance at the output and to stabilize the active device (32). An output matching and conditioning network (40) couples a mixed signal from the output of the active device to an output circuit (42). This network (40) matches impedances between the output circuit (42) and the active device (32) at the frequencies of the product signal, and desirably shorts the multiplicand signals' frequencies.

38 Claims, 3 Drawing Sheets

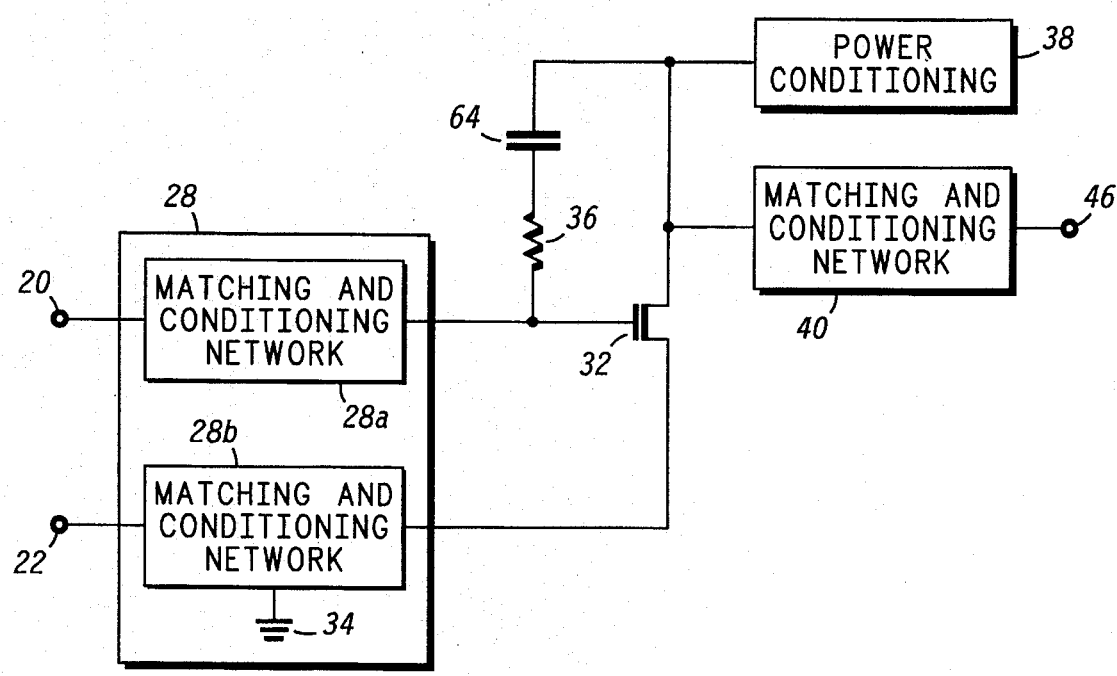
FIG. 4
FIG. 5
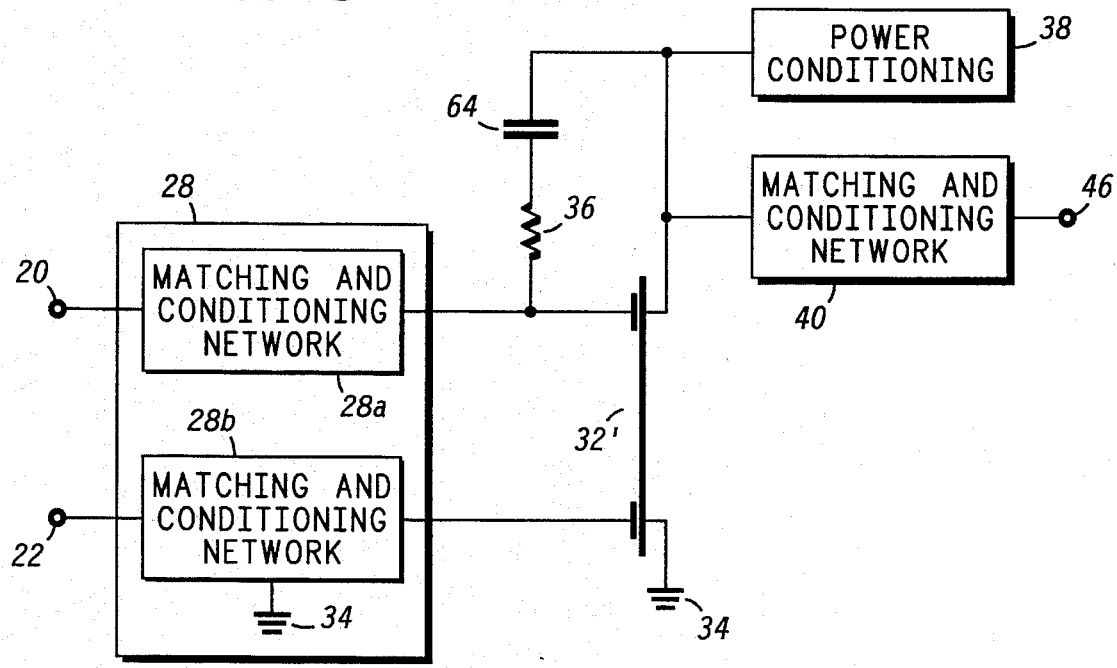

5,465,420

TRANSCONDUCTANCE MIXER WITH FEEDBACK

This application is a continuation of prior application Ser. No. 08/031,413, filed Mar. 15, 1993 now abandoned.

TECHNICAL FIELD OF THE INVENTION

The present invention relates generally to electronic mixers for use in downconverters, upconverters, and the like. More specifically, the present invention relates to transconductance mixers which achieve a high conversion gain.

BACKGROUND OF THE INVENTION

Transconductance mixers may be used in downconverters, upconverters, or other applications which require the multiplication of two signals. They exploit non-linear characteristics of active devices, such as field effect transistors (FETs). In the case of a downconverter, a transconductance mixer generates an intermediate frequency (IF) signal from a local oscillator (LO) signal and a radio frequency (RF) signal. Although not limited to use at any particular frequency range, they are particularly useful when operating at microwave frequencies.

Conversion gain or loss describes the ratio of the IF power to the RF power achieved by a mixer. Compared to diode mixers, which operate at a conversion loss, transconductance mixers operate at a relatively high conversion gain, often times in the 6–8 dB range. However, even higher conversion gains from transconductance mixers would be extremely useful. Generally speaking, high conversion gains are desirable, particularly in battery powered radios, because amplification stages may be omitted. By omitting amplification, more reliable, less complicated, and less expensive radio designs result, and such radio designs use the scarce resource of battery-supplied energy more efficiently.

Transconductance mixers simultaneously meet a plurality of diverse design criteria in order to achieve useful mixing. For example, any spurious signals near the IF range should be effectively eliminated from the input of the active device lest they become amplified and corrupt the desired IF signal. Likewise, LO and RF signals at the output of the active device should be effectively eliminated to prevent instability in the operation of the active device and to prevent degradation of the IF signal. Furthermore, sources of RF and LO signals should be impedance matched to the active device and the active device should be impedance matched to any output circuits which receive the IF signal. Any impedance mismatches result in a reduction of overall conversion gain.

Unfortunately, conventional transconductance mixers fail to satisfactorily meet these design criteria. Typically, in order to achieve stability while effectively eliminating IF range signals at the active device input and effectively eliminating RF and LO range signals at the active device output, impedance mismatches are tolerated. Consequently, overall conversion gain is reduced. Moreover, due to extreme high impedance levels typically presented at the output of the active device, matching networks which are suited to realization in microwave integrated circuits (MICs) and monolithic microwave integrated circuits (MMICs) cannot be used. Matching networks used in conventional transconductance mixers typically require physically large inductors which are not MIC or MMIC compatible. Thus, such matching networks are implemented using discrete lumped elements at an increase in cost, circuit complexity, manufacturing errors, and unreliability.

SUMMARY OF THE INVENTION

Accordingly, it is an advantage of the present invention that an improved transconductance mixer is provided.

Another advantage of the present invention is that a transconductance mixer which achieves a high conversion gain is provided.

Another advantage is that the present invention provides a transconductance mixer which results in a reduction in the amount of power consumed by a radio or other device in which it is used.

Another advantage is that the present invention provides an unconditionally stable transconductance mixer.

Another advantage is that the present invention provides a transconductance mixer that substantially matches impedances of sources of RF and LO signals with a non-linear active device and substantially matches impedances of the non-linear active device with output circuits that receive IF signals.

Another advantage is that the present invention provides a transconductance mixer which is suitable for implementation in a MIC or MMIC.

The above and other advantages of the present invention are carried out in one form by a transconductance mixer that includes a non-linear active device having first, second, and third nodes. A first coupling circuit couples to at least one of the first and second nodes. This first coupling circuit couples a first multiplicand input signal and a second multiplicand input signal to the active device. A second coupling circuit couples to the third node. The second coupling circuit adapts a first portion of a mixed signal produced at the third node of the active device into a product output signal. A feedback coupling circuit couples between the first coupling circuit and the second coupling circuit. The feedback coupling circuit feeds a second portion of the mixed signal back into the active device to lower impedance at the third node.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 4 shows a block diagram of a second embodiment of a transconductance mixer constructed in accordance with the teaching of the present invention; and FIG. 5 shows a block diagram of a third embodiment of a transconductance mixer constructed in accordance with the teaching of the present invention.

DETAILED DESCRIPTION OF THE PREFERRED EMBODIMENTS

Figure 1:
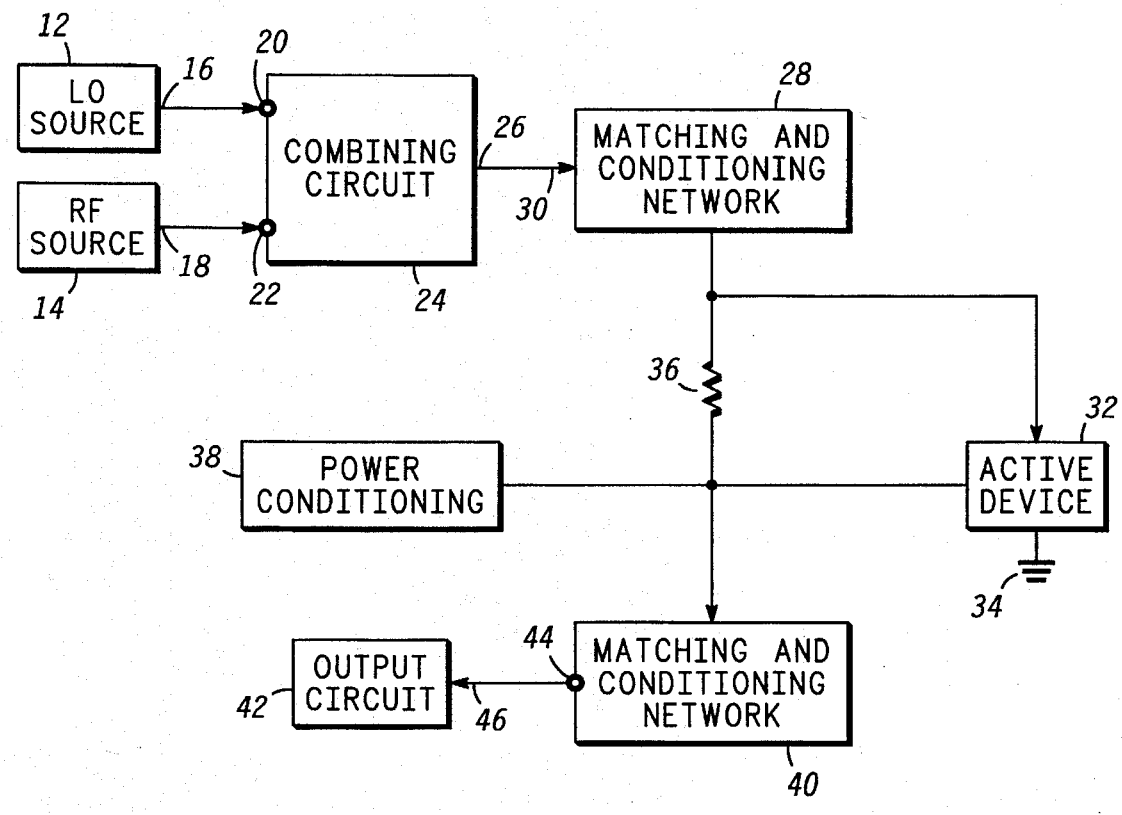
FIG. 1 shows a block diagram of a first embodiment of a transconductance mixer constructed in accordance with the teaching of the present invention.

FIG. 1 shows a block diagram of a first embodiment of a transconductance mixer circuit 10, hereinafter referred to as mixer 10. Mixer 10 essentially multiplies two multiplicand input signals together to produce a product output signal. In this first embodiment, mixer 10 is configured as a downconverter. Thus, mixer 10 includes a local oscillator (LO)

source 12 and a radio frequency (RF) source 14. LO source 12 generates an oscillating signal having a frequency which may be more or less close to the frequency of an oscillating RF signal provided by RF source 14. Conventional oscillator circuits may be used for LO 12. Preferably, RF source 14 includes RF acquisition and conditioning devices which are conventional in the art, such as an antenna, image filtering, RF amplifier, and the like. The LO and RF signals represent the multiplicand signals in this specific downconverter application.

LO source 12 and RF source 14 provide their respective LO and RF signals over transmission lines 16 and 18, respectively, which have predetermined characteristic impedances, preferably around 50 ohms. Transmission lines 16 and 18 couple to first and second ports 20 and 22, respectively, of a combining circuit 24. Combining circuit 24 combines the LO and RF signals into a combined signal. An output port 26 of combining circuit 24 provides the combined signal to an input port of an input matching and conditioning network 28 over a transmission line 30 having a predetermined characteristic impedance, preferably around 50 ohms. One of the functions of network 28 is to couple the combined signal to a non-linear active device 32. Thus, an output port of network 28 couples to a first node of a non-linear active device 32. In this first embodiment, a second node of active device 32 couples to a terminal 34 adapted to receive a common potential, such as a ground. A third node of active device 32 represents an output of active device 32.

Device 32 is a three or four node active device, such as a transistor, which has or can be biased to have non-linear characteristics that are suitable for mixing. A transconductance parameter represents one such characteristic. Transconductance is the ratio of an output signal, such as current, to an input signal, such as voltage, for a three or four node active device. If biased in a non-linear operating range, transconductance in many three or four node active devices is not constant but is a function of an input signal. Thus, if operated in this non-linear range, an output signal of the active device tends to reflect the multiplication an input signal with itself.

In the preferred embodiments of the present invention, output signals in active device 32 become a function of the combined signal multiplied by itself. The combined signal represents the sum of the LO and RF signals. A multiplication of the combined signal by itself generates a mixed signal which includes components that are the product of the LO and RF signals along with other unwanted components. Those skilled in the art will appreciate that the product of LO and RF signals manifests itself in components exhibiting frequencies which are the sum and difference of the frequencies of the LO and RF signals. Conditioning circuits (discussed below) select desired components or portions of the mixed signal for use as the product output signal from mixer 10. As is conventional in mixers used for downconverting, the difference signal component or portion of the mixed signal is desired as an IF signal.

A feedback coupling circuit 36, represented as a resistor in FIG. 1, couples between the third and first nodes of active device 32. Thus, a portion, and preferably a small portion, of the mixed signal is added out-of-phase to the combined signal and fed back into the input of active device 32. Circuit 36 and the feedback provided therethrough cause the impedance at the third node of active device 32 to be lower than it would be without circuit 36 in place. In addition, circuit 36 causes mixer 10 to become unconditionally stable.

A power conditioning circuit 38 couples to the third node of active device 32. Power conditioning circuit 38 provides energization to active device 32. The third node of active device 32 additionally couples to and supplies the mixed signal to an input port of a matching and conditioning network 40. One of the functions of network 40 is to couple a desired portion of the mixed signal to an output circuit 42. Thus, an output port 44 of network 40 couples to an input port of output circuit 42 through a transmission line 46 having a predetermined characteristic impedance, preferably around 50 ohms.

Matching and conditioning networks 28 and 40 cooperate with active device 32 in forming mixer 10. Matching and conditioning network 28 is preferably configured to match impedances presented to it by transmission line 30, combining circuit 24, LO source 12 and RF source 14. In addition, network 28 is preferably configured to match the impedance presented to it by the first node of active device 32 and feedback coupling circuit 36. However, these impedances vary as a function of frequency. Preferably, network 28 is further configured so that impedance matching at its output port takes place only for frequencies in the range of the RF and LO signals. Network 28 provides substantially a short, or an impedance of zero, at its output port for frequencies near the IF.

By substantially matching impedances at RF and LO frequencies, nearly maximum signal power is transferred through network 28 to active device 32. By shorting IF frequencies at the input to active device 32, spurious signals in the IF frequency range are not amplified by active device 32. By preventing amplification of IF range signals, such signals do not corrupt the true IF signal component of the mixed signal.

Matching and conditioning network 40 is preferably configured at its input port to match impedances presented to it by the third port of active device 32. In addition, network 40 is preferably configured at its output port to match the impedance presented to it by transmission line 46 and output circuit 42. However, these impedances again vary as a function of frequency. Preferably, network 40 is further configured so that impedance matching takes place only for frequencies around the range of the IF signal. Network 40 provides substantially a short, or an impedance of zero, at its input port for frequencies near the LO and RF signals.

By substantially matching impedances at IF frequencies, nearly a maximum amount of power is transferred from active device 32, through network 40, to output circuit 42. By shorting RF and LO frequencies at the input of network 40 and the output of active device 32, RF power is prevented from building and corrupting the operation of active device 32 and the generation of IF components in the mixed signal.

Figure 2:
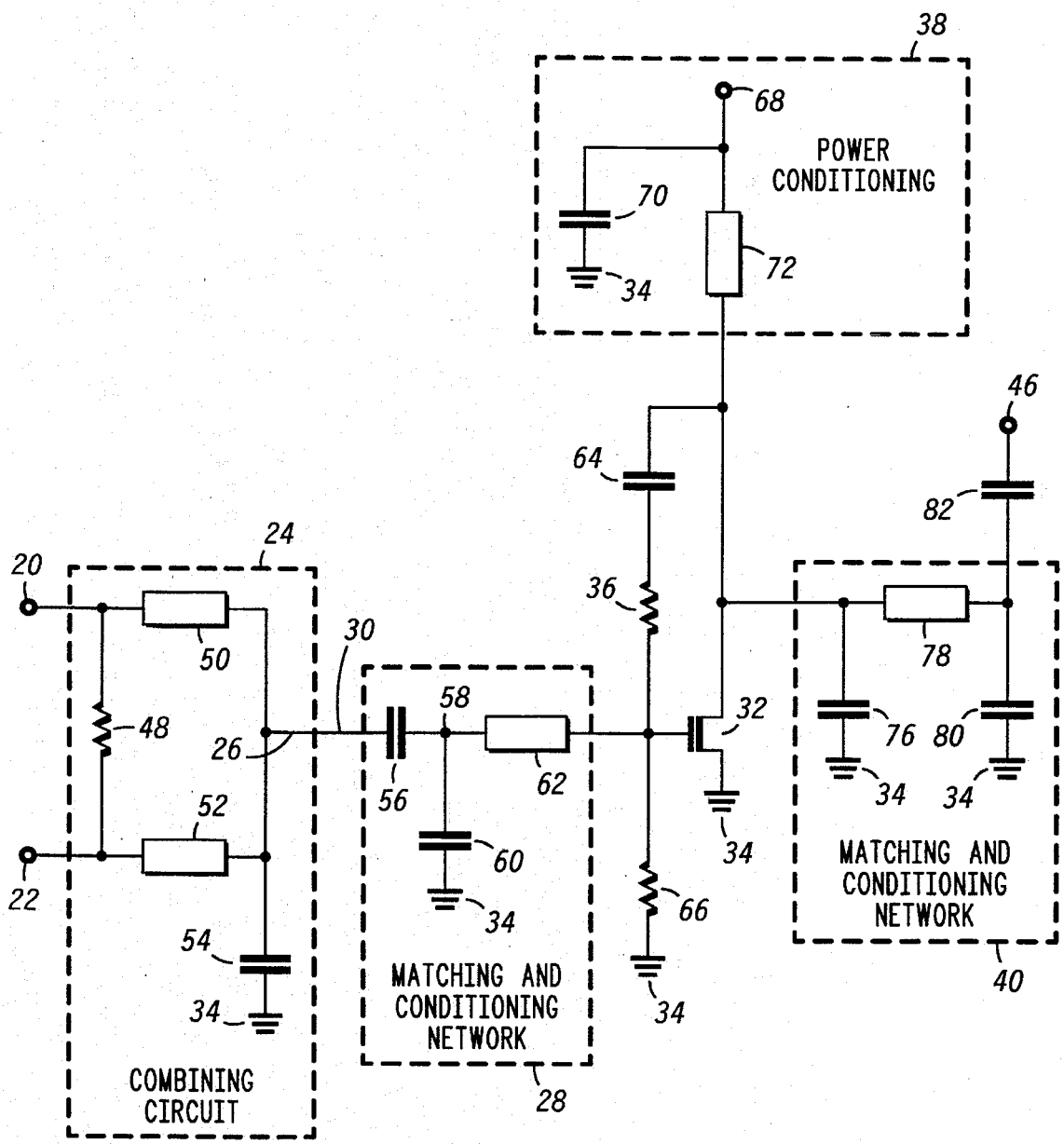
FIG. 2 shows a schematic diagram of the first embodiment of the transconductance mixer.

FIG. 2 shows a schematic diagram of portions of mixer 10. In particular, combining circuit 24 includes a resistor 48 coupled between ports 20 and 22 thereof, an inductor 50 coupled between ports 20 and 26 thereof, an inductor 52 coupled between ports 22 and 26 thereof, and a capacitor 54 coupled between port 26 and ground terminal 34. Those skilled in the art will appreciate that this embodiment of combining circuit 24 constitutes a lumped element equivalent circuit for a conventional Wilkenson combiner.

Transmission line 30 couples between combining circuit 24 and matching and conditioning network 28. A blocking capacitor 56 couples between the input port of network 28 and an internal node 58. Those skilled in the art will appreciate that blocking capacitor 56 has substantially no influence over the impedance characteristics of network 28. Network 28 includes a capacitor 60 which couples between internal node 58 and ground terminal 34, and an inductor 62 which couples between internal node 58 and the output port of network 28.

A field effect transistor (FET) represents active device 32 in this embodiment. A gate of FET 32 serves as the above-discussed first node of the active device, a source of FET 32 serves as the above-discussed second node of the active device, and a drain of FET 32 serves as the above-discussed third node of the active device. Mixer 10 preferably operates in microwave frequency ranges, and FET 32 is desirably a MESFET. However, those skilled in the art will appreciate that other types of active devices, such as high electron mobility transistors (HEMTs) and the like, may serve as active device 32.

The output port of network 28 couples to the gate of FET 32. The source of FET 32 couples to ground terminal 34. A DC blocking capacitor 64 couples between the drain of FET 32 and a first node of feedback resistor 36. A second node of feedback resistor 36 couples to the gate of FET 32. A biasing resistor 66 couples between the gate of FET 32 and the source of FET 32 through ground terminal 34. Power conditioning circuit 38 includes a terminal 68, which is adapted to receive a positive voltage potential relative to the common potential of terminal 34. A decoupling capacitor 70 couples between positive terminal 68 and ground terminal 34. An RF choke couples between terminal 68 and the drain of FET 32.

FET 32 is a non-linear active device when operated near its pinch-off point, where its transconductance is significantly influenced by its gate voltage. Blocking capacitor 64 prevents a biasing voltage from being developed at the gate of FET 32 through resistor 36. Rather, biasing voltage at the gate of FET 32 is developed from the LO signal across biasing resistor 66.

Figure 3:
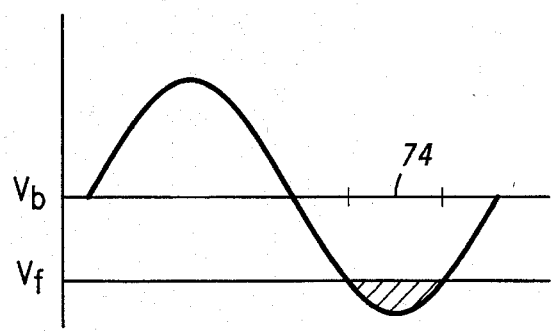
FIG. 3 shows a timing diagram depicting a single cycle of an LO signal.

FIG. 3 shows a timing diagram depicting a single cycle of the combined LO and RF signals at the gate of FET 32. The amplitude of this combined signal is predominately determined by the LO signal. Thus, the timing diagram of FIG. 3 may be viewed as a single cycle of the LO signal. As shown in FIG. 3, the amplitude of the LO signal is controlled at LO source 12 (see FIG. 1) so that it oscillates around a bias point $V_b$.

With reference to FIGS. 2 and 3, $V_f$ represents the voltage for FET 32 at which the gate-source junction of FET 32 becomes forward biased and begins to conduct current between the source and the gate. The amplitude of the LO signal is controlled so that its peak negative voltage is less than $V_f$. Hence, for a portion of the LO signal cycle, indicated at time duration 74 in FIG. 3, FET 32 becomes forward biased and rectifies the LO signal. The rectification current from the source of FET 32 flows through biasing resistor 66 and the gate-source junction of FET 32 to create a biasing voltage at the gate of FET 32. Due to capacitor 60 in network 28 and intrinsic capacitances present at the gate of FET 32, this biasing voltage persists throughout the remainder of the LO signal cycle.

The use of the LO signal to bias FET 32 is desirable because it negates the need for a negative power supply, which would increase costs and weight along with space and power requirements. Moreover, no resistor is needed at the source of FET 32. The omission of a source resistor for FET 32 increases achievable drain-source voltages across FET 32 for a given supply voltage provided by power conditioning circuit 38. Thus, a given output level may be achieved with less battery voltage.

The input port of matching and conditioning network 40 also couples to the drain of FET 32. Network 40 includes a capacitor 76 which couples between the input port of network 40 and ground terminal 34, an inductor 78 which couples between the input and output ports of network 40, and a capacitor 80 which couples between the output port of network 40 and ground terminal 34. A DC blocking capacitor 82 couples between the output port of network 40 and transmission line 46.

Network 40 represents a conventional low pass frequency matching circuit architecture. Due to the inclusion of feedback resistor 36, the impedance presented to network 40 by the drain of FET 32 is considerably lower than would be the case if resistor 36 were omitted. For example, an impedance on the order of 1000 ohms might be expected at the drain of FET 32 were resistor 36 omitted. However, with resistor 36 included in mixer 10, this impedance may desirably be around 200 ohms or less. With the impedance at the drain of FET 32 at 200 ohms or less, the function of network 40 in matching this impedance to a typical transmission line impedance, such as 50 ohms, is a routine matter which can easily be accomplished. Moreover, this matching goal can be accomplished using easily realizable, physically small inductive components that may be implemented in a microwave integrated circuit (MIC) or a monolithic microwave integrated circuit (MMIC).

Those skilled in the art may devise particular values for the specific components depicted in FIG. 2 so that the above discussed goals for mixer 10 are achieved. Moreover, those skilled in the art will appreciate that each application for mixer 10 will utilize different values for these components. An exemplary set of components for one particular application is described by Table I, presented below.

TABLE I

EXEMPLARY MIXER OPERATING PARAMETERS

RF frequency—1925 MHz
LO frequency—1850 MHz
IF frequency—75 MHz
LO power—>6.0 dbm

| Component Reference Number | Value Identity | Component Reference Number | Value Identity |
|---|---|---|---|
| 48 | 100 ohms | 36 | 2K ohms |
| 50 | 3.9 nh | 32 | NE76038 |
| 52 | 3.9 nh | 68 | 3.0 Volt |
| 54 | 1.59 pf | 76 | 33 pf |
| 56 | 1000 pf | 78 | 190 nh |
| 60 | 1.75 pf | 80 | 46 pf |
| 62 | 18 nh | 82 | 1000 pf |
| 64 | 10 pf | | |

The scope of the particular invention is not limited to the particular basic circuit architecture depicted in FIGS. 1–3. FIG. 4 shows a block diagram of a second embodiment of transconductance mixer 10. This second embodiment differs from the first embodiment depicted in connection with FIGS. 1–3 primarily in that multiplicand signals are supplied to the gate and source of FET 32 rather than being combined and supplied only to the gate. As discussed above in connection with FIGS. 1–3, feedback resistor 36 couples between the drain and gate of FET 32 to lower the impedance of FET 32 at its drain and stabilize the operation of FET 32.

In order to couple multiplicand signals supplied at ports 20 and 22 of matching and conditioning network 28 to FET 32, network 28 may desirably be split into two separate networks 28a and 28b. A lower power first multiplicand signal, such as an RF signal, may desirably be coupled to the gate of FET 32 through network 28a, and a higher power second multiplicand signal, such as a LO signal, may desirably be coupled to the source of FET 32 through network 28b. Network 28a may be specifically designed to match impedances at the frequency of the first multiplicand signal and network 28b may be specifically designed to match impedances at the frequency of the second multiplicand signal.

The architecture of this second embodiment may be desirable when the frequency ranges of the first and second multiplicand signals are not close to one another. This embodiment provides slightly more control over matching impedances at the frequencies of the multiplicand signals. On the other hand, an LO signal exhibiting higher power may be required when compared to the first embodiment described above in connection with FIGS. 1–3.

FIG. 5 depicts a third embodiment of mixer 10. The third embodiment is similar to the second embodiment except that a dual gate FET 32' is used as the non-linear active device. As discussed above in connection with the second embodiment depicted in FIG. 4, the multiplicand signals are separately impedance-matched with FET 32' through networks 28a and 28b. Moreover, feedback resistor 36 couples between the drain and one of the gates of FET 32' to lower the impedance of FET 32 at its drain and to stabilize the operation of FET 32. However, two multiplicand signals are supplied to the two gates of FET 32', rather than supplying one of the multiplicand signals to the source of FET 32 as shown above in connection with FIG. 4. This embodiment may be advantageous when the two multiplicand signals exhibit frequencies which are not close to one another.

In summary, the present invention provides an improved transconductance mixer. The mixer achieves a high conversion gain because the active device is unconditionally stable, allowing improved impedance matching between an active device on one hand and input and output matching networks on the other. The unconditional stability results from the inclusion of a feedback resistor across a non-linear active device. This feedback resistor additionally lowers the output impedance of the active device so that a matching network at the output of the mixer can be realized using low value inductors, which are suitable for implementation using MIC or MMIC techniques. Due to the high conversion gain, amplification need not be included elsewhere in a radio or other device which includes the mixer, and a power savings results. Moreover, in one embodiment the active device is biased from an LO signal rather than a negative power supply. This allows a greater output signal from a given amount of battery voltage.

The present invention has been described above with reference to preferred embodiments. However, those skilled in the art will recognize that changes and modifications may be made in these preferred embodiments without departing from the scope of the present invention. For example, while the preferred embodiments have been described with reference to a mixer used in a downconverter, those skilled in the art can easily adapt the present invention for use in upconverter and other mixer applications. These and other changes and modifications which are obvious to those skilled in the art are intended to be included within the scope of the present invention.

What is claimed is:

1. A transconductance mixer having first and second input terminals for receiving, respectively, first and second multiplicand signals, and an output terminal for providing a mixed signal, and comprising:

a non-linear active device having one or more input nodes, a reference node and an output node, wherein the output node has an output impedance;

a first circuit for coupling said first multiplicand signal from said first input terminal of the mixer to a first input node of said active device and for coupling said second multiplicand signal from said second input terminal of the mixer to either said first input node or said reference node or a second input node of said active device;

a second circuit extending between said output node of said active device and said output terminal of said mixer, for coupling to said output terminal of said mixer a first portion of a product signal produced from said first and second multiplicand signals by said active device and appearing at said output node of said active device, wherein said first portion of said product signal forms said mixed signal; and a feedback circuit having an impedance which decreases with increasing frequency at operating frequencies of the mixer for passing AC signals but not DC signals, said feedback circuit being coupled between said first circuit and said output node of said active device, for feeding a second portion of said product signal back into said first input node of said active device to lower said output impedance at a frequency of said mixed signal.

2. A transconductance mixer as claimed in claim 1 wherein said feedback circuit has a first node coupled to said output node of said active device and a second node coupled to said first input node of said active device.

3. A transconductance mixer as claimed in claim 2 wherein said feedback circuit comprises a series coupled resistor and capacitor.

4. A transconductance mixer as claimed in claim 1 wherein:

said first circuit presents a first impedance to said active device, said first impedance being approximately zero at said frequency of said mixed signal.

5. A transconductance mixer as claimed in claim 4 wherein:

said first multiplicand signal exhibits frequencies within a predetermined frequency range;

said active device presents a second impedance to said first circuit; and said first circuit presents an impedance to said active device which substantially matches said second impedance in said predetermined frequency range.

6. A transconductance mixer circuit as claimed in claim 1 wherein:

said first and second multiplicand signals exhibit frequencies within, respectively, predetermined first and second frequency ranges; and said second circuit presents an input impedance to said output node of said active device, said input impedance being approximately zero throughout said first and second frequency ranges.

7. A transconductance mixer as claimed in claim 6 wherein:

said mixed signal exhibits frequencies within a predetermined third frequency range; and said input impedance of said second circuit approximately equals said output impedance of said active device within said third frequency range.

8. A transconductance mixer as claimed in claim 1 wherein:

said non-linear active device is a field effect transistor (FET) having a gate, a source, and a drain; and said first input node of said active device is said gate, said reference node is said source, and said output node is said drain, and said first multiplicand signal is coupled to said gate and said second multiplicand is coupled to said gate or said source.

9. A transconductance mixer as claimed in claim 8 wherein a rectifying junction is present between said gate and source in said device when the first and second multiplicand signals are coupled to said gate, said mixer additionally comprising:

a resistance coupled between said gate and said source; and a signal source for providing said first multiplicand signal which exhibits cycles, said signal source being coupled through said first circuit to said gate, and said signal source providing said first multiplicand signal to said gate at an amplitude sufficiently great to forward bias said rectifying junction during a portion of each cycle of said first multiplicand signal.

10. A transconductance mixer having first and second input terminals for receiving, respectively, first and second multiplicand signals, and an output terminal for providing a mixed signal of a predetermined output frequency, wherein said mixer comprises:

an FET having a gate node, a source node and a drain node, wherein the drain node has an output impedance;

a combining circuit having first, second, and third ports, said combining circuit's first port receiving said first multiplicand signal, and said combining circuit's second port receiving said second multiplicand signal;

a conditioning network having an input port coupled to said combining circuit's third port and an output port coupled to said gate node of said FET, said conditioning network presenting an impedance to said gate terminal of said FET that is approximately zero at said output frequency;

an output matching circuit coupled between said drain node and said output node of said mixer; and a feed back circuit coupled between said drain node and said gate node, said feedback circuit providing AC but not DC coupling therebetween and having an impedance which decreases with increasing frequency at operating frequencies of the mixer.

11. A transconductance mixer circuit for mixing first and second multiplicand signals to produce a product signal, said circuit comprising:

a non-linear active device having at least first, second, and third nodes;

a first matching and conditioning network for coupling said first and second multiplicand signals to said active device via at least one of said first and second nodes of said active device;

a second matching and conditioning network, coupled to said third node of said active device, for transmitting a first portion of said product signal appearing at said third node to an output of the mixer circuit; and a resistor and a capacitor serially coupled between said third node of said active device and said first node of said active device, for feeding a second portion of said product signal back into said first node to lower an output impedance of said device at said third node.

12. A transconductance mixer circuit as claimed in claim 11 wherein:

said non-linear active device is a field effect transistor (FET) having a gate, a source, and a drain; and said first node of said active device is said gate, said second node is said source, and said third node is said drain.

13. A transconductance mixer circuit as claimed in claim 12 wherein said resistor and capacitor couple between said gate and drain of said FET.

14. A transconductance mixer circuit as claimed in claim 13 wherein said gate and source comprise a rectifying junction when the first and second multiplicand signals are coupled to said gate, said circuit additionally comprising:

a second resistance coupled between said gate and said source; and a signal source for providing said first multiplicand signal, said signal source being coupled through said first matching and conditioning network to said gate, and said signal source being configured to provide said first multiplicand signal to said gate at an amplitude sufficiently great to forward bias said rectifying junction during a portion of each cycle of said first multiplicand signal.

15. A transconductance mixer circuit as claimed in claim 14 wherein said first portion of said product signal exhibits an output frequency and said first matching and conditioning network comprise:

a combining circuit having first, second, and third ports, said combining circuit's first port receiving said first multiplicand signal, and said combining circuit's second port receiving said second multiplicand signal; and a conditioning network having an input port coupled to said combining circuit's third port and an output port coupled to said gate of said FET, said conditioning network presenting an impedance to said gate of said FET that is approximately zero at said output frequency.

16. A transconductance mixer circuit as claimed in claim 11 additionally comprising a first signal source for providing said first multiplicand signal, said first signal source being coupled to said first matching and conditioning network, and wherein:

said first portion of said product signal exhibits frequencies from a first predetermined range of frequencies;

said first multiplicand signal exhibits frequencies from a second predetermined range of frequencies;

said first signal source presents a first impedance to said first matching and conditioning network said active device presents a second impedance to said first matching and conditioning network and wherein said first and second impedances are substantially matched in said second predetermined range of frequencies; and said first matching and conditioning network presents an approximately zero impedance to said active device in said first predetermined range of frequencies.

17. A transconductance mixer circuit as claimed in claim 11 wherein:

said first portion of said product signal exhibits frequencies from a first predetermined range of frequencies;

said first and second multiplicand signals exhibit frequencies, respectively, from second and third predetermined ranges of frequencies;

said second matching and conditioning network presents a first impedance to said active device;

said active device presents a second impedance to said second matching and conditioning network, wherein said first and second impedances are substantially matched in said first predetermined range of frequencies; and said second matching and conditioning network presents an approximately zero impedance to said active device in said second and third predetermined ranges of frequencies.

18. A method for operating a transconductance mixer to produce a product signal from first and second multiplicand signals, said method comprising the steps of:

providing a non-linear active device having at least first, second, and third nodes;

coupling said first and second multiplicand signals to said active device via at least said first and second nodes of said active device, so that said product signal appears at said third node of said active device;

coupling a first portion of said product signal to an output circuit; and feeding back, via a DC-blocking path having an impedance which decreases with increasing frequency at operating frequencies of the mixer and which extends between said third node and said first node of said active device, a second portion of said product signal so as to reduce an output impedance of said active device at said third node.

19. A method for operating a transconductance mixer as claimed in claim 18 wherein said feeding back step comprises providing a series coupled resistor and capacitor in said DC blocking path extending between said third node of said active device and said first node of said active device.

20. A method for operating a transconductance mixer as claimed in claim 19 wherein the step of providing said non-linear active device comprises:

providing as the non-linear active device, a field effect transistor (FET) having a gate, a source, and a drain, wherein said first node of said non-linear active device is said gate, said second node is said source, and said third node is said drain, and wherein said step of providing the series coupled resistor and capacitor in said DC blocking path, comprises coupling said resistor and capacitor between said drain and said gate.

21. A method for operating a transconductance mixer as claimed in claim 18 further comprising the steps of:

obtaining said first multiplicand signal from a signal source which exhibits a first impedance;

presenting a second impedance to said first and second multiplicand signals; and said first and second multiplicand signal coupling step comprises the step of substantially matching said first and second impedances.

22. A method for operating a transconductance mixer as claimed in claim 21 further comprising the steps of:

using said product signal which exhibits frequencies from a first predetermined range of frequencies; and using said first and second multiplicand signals which exhibit frequencies from a second predetermined range of frequencies.

23. A method for operating a transconductance mixer as claimed in claim 22, wherein said matching step matches said first and second impedances in said second predetermined range of frequencies.

24. A method of operating a transconductance mixer as claimed in claim 22, wherein said first and second multiplicand signals coupling step comprises the step of substantially shorting said node of said active device at which said multiplicand signals are provided in said first predetermined range of frequencies by means of a frequency selective circuit.

25. A method for operating a transconductance mixer as claimed in claim 18 wherein said step of coupling said first portion of said product signal to said output circuit comprises coupling it to an output circuit that exhibits a first impedance, and wherein the step of providing a nonlinear active device comprises providing a device exhibiting a second impedance at said third node, and further comprising adjusting said DC-blocking path so as to substantially match said first and second impedances.

26. A method for operating a transconductance mixer as claimed in claim 25, wherein said step of coupling said first portion of said product signal to said output circuit comprises coupling it to an output circuit that exhibits substantially zero impedance at frequencies of said multiplicand signals.

27. A method for operating a transconductance mixer as claimed in claim 18 wherein the feeding back step comprises feeding back via a series coupled resistor and capacitor.

28. A method for operating a transconductance mixer as claimed in claim 18 wherein said step of coupling first and second multiplicand signals comprises providing said first multiplicand signal of amplitude sufficient to forward bias a rectifying junction at said input of said device during a portion of an oscillatory cycle of said first multiplicand signal.

29. A method for operating a transconductance mixer as claimed in claim 18 wherein said step of providing a non-linear active device comprises providing said device with two input nodes, a reference node and an output node, wherein said third node is said output node and said first multiplicand signal is coupled to said first input node and said second multiplicand signal is coupled to said second input node and said feeding back step comprises feeding back via said DC-blocking path extending between said output node and said first input node, and wherein said first coupling step comprises coupling said first multiplicand signal to said first input with an amplitude sufficient to forward bias a rectifying junction of said device during a portion of an oscillatory cycle of said first multiplicand signal.

30. A method for operating a transconductance mixer as claimed in claim 18 further comprising providing a DC-blocking path having a predetermined resistance between said first and second nodes of said device.

31. A transconductance mixer having first and second input ports and an output port, said mixer comprising:

a non-linear active device having one or more input nodes, a reference node and an output node, wherein said output node has an output impedance;

first circuit means for coupling a first multiplicand signal from said first input port of said mixer to a first input node of said device and a second multiplicand signal from said second input port of said mixer to a second input node or said reference node of said device;

second circuit means for coupling a signal comprising a product of said first and second multiplicand signals appearing at said output node of said device to said output port of said mixer; and third circuit means providing a DC-blocking signal path having an impedance which decreases with frequency at operating frequencies of the mixer, between said output node and said first input node of said device, for feeding back part of said signal appearing at said output node of said device to reduce said output impedance.

32. The mixer of claim 31 wherein said first multiplicand signal comprises an LO signal coupled to said first input port and said second multiplicand signal comprises an RF signal coupled to said second input port and said third circuit means is coupled between said output node and said first input node.

33. A transconductance mixer, comprising:
a non-linear active device having an input node, a reference node and an output node, wherein said output node has an output impedance;
first circuit means for coupling first and second multiplicand signals from input ports of said mixer to said input and reference nodes of said device;
second circuit means for coupling a signal comprising a product of said first and second multiplicand signals appearing at said output node of said device to an output port of said mixer; and
a feedback circuit providing a DC-blocking signal path comprising a resistor and capacitor between said output node and said input node for feeding back part of said product signal from said output node to said input node to reduce said output impedance of said output node of said device.

34. The mixer of claim 33 wherein the DC-blocking signal path is substantially non-resonant at operating frequencies of the mixer.

35. The mixer of claim 34 wherein said first multiplicand signal is coupled to said input node of said device and said second multiplicand signal is coupled to said reference node of said device and wherein said first circuit means provides said first multiplicand signal of amplitude large enough to forward bias an input rectifying junction of said device during a portion of an oscillatory cycle of said first multiplicand signal.

36. A method of operation of a transconductance mixer utilizing a non-linear active device to mix an LO signal at a first input of the mixer and an RF signal at a second input of the mixer to produce an IF signal, comprising the steps of:
coupling the LO signal to a first input node of the active device and coupling the RF signal to another input node or a reference node of the active device, thereby producing the IF signal at an output node of the active device; and
feeding back a portion of the IF signal from the output node of the active device to the first input node of the active device using a serial coupled resistor and capacitor, thereby reducing output impedance of the output node of the active device at frequencies corresponding to the IF signal.

37. The method of claim 36 wherein the step of coupling the LO signal to the first input node comprises coupling the LO signal with sufficient magnitude to forward bias a rectifying junction of the active device during a portion of an oscillatory cycle of the LO signal.

38. The method of claim 36 further comprising providing a DC return path from the first input node to the reference node of the active device.

* * * * *

UNITED STATES PATENT AND TRADEMARK OFFICE
CERTIFICATE OF CORRECTION

PATENT NO. : 5,465,420
DATED : November 7, 1995
INVENTOR(S) : Richard M. Dougherty et al.

It is certified that error appears in the above-indentified patent and that said Letters Patent is hereby corrected as shown below:

Column 10, claim 16, line 47, "network said" should be --network, said--.

Signed and Sealed this

Twenty-eighth Day of May, 1996

Attest:

BRUCE LEHMAN

*Attesting Officer*       *Commissioner of Patents and Trademarks*